United States Patent
Wada et al.

(10) Patent No.: US 10,665,496 B2
(45) Date of Patent: May 26, 2020

(54) SWITCH ELEMENT AND LOAD DRIVING DEVICE

(71) Applicant: Hitachi Automotive Systems, Ltd., Hitachinaka-shi, Ibaraki (JP)

(72) Inventors: Shinichirou Wada, Tokyo (JP); Takayuki Oshima, Hitachinaka (JP); Katsumi Ikegaya, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/741,614

(22) PCT Filed: Jul. 1, 2016

(86) PCT No.: PCT/JP2016/069580
§ 371 (c)(1),
(2) Date: Jan. 3, 2018

(87) PCT Pub. No.: WO2017/014024
PCT Pub. Date: Jan. 26, 2017

(65) Prior Publication Data
US 2018/0218936 A1     Aug. 2, 2018

(30) Foreign Application Priority Data

Jul. 17, 2015   (JP) ................... 2015-142562

(51) Int. Cl.
*H01L 21/762*     (2006.01)
*H01L 27/088*     (2006.01)
(Continued)

(52) U.S. Cl.
CPC ........ *H01L 21/7624* (2013.01); *H01L 21/762* (2013.01); *H01L 21/822* (2013.01);
(Continued)

(58) Field of Classification Search
CPC ... H01L 29/06; H01L 27/088; H01L 21/8234; H01L 21/7624; H01L 21/762;
(Continued)

(56) References Cited

U.S. PATENT DOCUMENTS 4,420,700 A * 12/1983 Fay .................. H03K 17/06
                                                    323/282
5,828,112 A * 10/1998 Yamaguchi ......... H01L 27/0635
                                                    257/378
(Continued)

FOREIGN PATENT DOCUMENTS

JP     10-256541 A     9/1998
JP     10256541 A * 9/1998
(Continued)

OTHER PUBLICATIONS

International Search Report (PCT/ISA/210) issued in PCT Application No. PCT/JP2016/069580 dated Sep. 13, 2016 with English translation (4 pages).
(Continued)

*Primary Examiner* — Allen L Parker
*Assistant Examiner* — Charles N Ausar-El
(74) *Attorney, Agent, or Firm* — Crowell & Moring LLP

(57) ABSTRACT

It is an object of the present invention to provide a switch element and a load driving apparatus capable of suppressing a characteristic change of an on-resistance without lowering an off-breakdown voltage. The switching element includes a control electrode, an active element region, and an inactive element region, and the active element region and the inactive element region are formed adjacent to each other on the control electrode. Alternatively, in the load driving apparatus including a current driving switch element and a current detecting switch element that is connected in parallel to the load driving switch element and that detects an
(Continued)

energization current of the load driving switch element, the current detecting switch element includes at least a control electrode, an active element region, and an inactive element region, and the active element region and the inactive element region are formed adjacent to each other on the control electrode.

7 Claims, 8 Drawing Sheets

(51) Int. Cl.
| | |
|---|---|
| *H01L 29/786* | (2006.01) |
| *H03K 17/687* | (2006.01) |
| *H01L 29/78* | (2006.01) |
| *H01L 27/02* | (2006.01) |
| *H01L 29/08* | (2006.01) |
| *H01L 21/822* | (2006.01) |
| *H01L 29/06* | (2006.01) |
| *H01L 21/8234* | (2006.01) |

(52) U.S. Cl.
CPC ...... *H01L 21/8234* (2013.01); *H01L 27/0207* (2013.01); *H01L 27/088* (2013.01); *H01L 29/06* (2013.01); *H01L 29/0696* (2013.01); *H01L 29/0865* (2013.01); *H01L 29/786* (2013.01); *H01L 29/7824* (2013.01); *H01L 29/7826* (2013.01); *H01L 29/78624* (2013.01); *H03K 17/687* (2013.01)

(58) Field of Classification Search
CPC ............ H01L 29/7826; H01L 29/7824; H01L 29/0865; H01L 29/0696; H01L 27/0207; H01L 21/822; H01L 29/786; H01L 29/78624; H03K 17/687

See application file for complete search history.

(56) References Cited

U.S. PATENT DOCUMENTS

| | | | | |
|---|---|---|---|---|
| 6,015,745 | A * | 1/2000 | Adkisson | H01L 21/76224 |
| | | | | 257/E21.546 |
| 7,294,901 | B2 * | 11/2007 | Shimizu | H01L 21/763 |
| | | | | 257/492 |
| 9,484,411 | B1 * | 11/2016 | Venkitachalam | |
| | | | | H01L 21/823807 |
| 9,525,062 | B2 * | 12/2016 | Ishida | H01L 29/7824 |
| 9,595,523 | B2 * | 3/2017 | Shim | H01L 27/088 |
| 9,893,055 | B2 * | 2/2018 | Ishii | H01L 21/76 |
| 10,340,379 | B2 * | 7/2019 | Furuya | H01L 29/0649 |
| 10,461,072 | B2 * | 10/2019 | Edwards | H01L 21/26513 |
| 2005/0218459 | A1 * | 10/2005 | Satsukawa | H01L 27/0207 |
| | | | | 257/379 |
| 2008/0079481 | A1 | 4/2008 | Tomita | |
| 2010/0032772 | A1 | 2/2010 | Tanaka | |
| 2012/0299108 | A1 * | 11/2012 | Harada | H01L 21/84 |
| | | | | 257/355 |
| 2013/0069156 | A1 | 3/2013 | Miura | |
| 2013/0277738 | A1 | 10/2013 | Sayama | |
| 2014/0284714 | A1 | 9/2014 | Miyakoshi et al. | |
| 2016/0276477 | A1 * | 9/2016 | Wada | H01L 29/0696 |
| 2017/0358600 | A1 * | 12/2017 | Becker | H01L 27/0207 |
| 2017/0365600 | A1 * | 12/2017 | Sinha | H01L 23/481 |
| 2017/0365621 | A1 * | 12/2017 | Becker | H01L 27/0207 |

FOREIGN PATENT DOCUMENTS

| | | | |
|---|---|---|---|
| JP | 11-330451 A | | 11/1999 |
| JP | 2006-286990 A | | 10/2006 |
| JP | 2007-149869 A | | 6/2007 |
| JP | 2008-91547 A | | 4/2008 |
| JP | 2010-40896 A | | 2/2010 |
| JP | 2012-156205 A | | 8/2012 |
| JP | 2013-69778 A | | 4/2013 |
| JP | 2014-187082 A | | 10/2014 |
| JP | WO2015072295 A1 | * | 5/2015 |
| WO | WO 2015/072295 A1 | | 5/2015 |

OTHER PUBLICATIONS

Japanese-language Written Opinion (PCT/ISA/237) issued in PCT Application No. PCT/JP2016/069580 dated Sep. 13, 2016 (5 pages).
Extended European Search Report issued in counterpart European Application No. 16827588.1 dated Feb. 19, 2019 (nine (9) pages).

* cited by examiner

SWITCH ELEMENT AND LOAD DRIVING DEVICE

TECHNICAL FIELD

The present invention relates to a switch element such as a current detecting metal oxide semiconductor field effect transistor (MOSFET) and a load driving apparatus using the switch element, and more particularly to a current detecting MOSFET suitable for highly accurately controlling an electric actuator such as a motor and a solenoid and a load driving apparatus using the current detecting MOSFET.

BACKGROUND ART

Conventionally, a switch element provided with an active element region and an inactive element region is known (for example, PTL 1). It is described that in this switch element, the pitch of a dummy gate in the inactive element region is set in consideration of characteristic deterioration due to a leakage caused by crystal defects or the like, and a control electrode in the active element region is provided not to reach the inactive element region.

CITATION LIST

Patent Literature

PTL 1: JP 2007-149869 A

SUMMARY OF INVENTION

Technical Problem

However, in the above-described conventional switch element, a gate electrode is separated at least between the active region and the inactive region. Therefore, in a lateral metal oxide semiconductor (MOS) transistor having a linear gate electrode, an off-breakdown voltage may decrease in a separated portion region.

It is therefore an object of the present invention to provide a switch element and a load driving apparatus capable of suppressing a characteristic change of an on-resistance without lowering an off-breakdown voltage of an element.

Solution to Problem

The present invention includes a control electrode, an active element region, and an inactive element region, and the active element region and the inactive element region are formed adjacent to each other on the control electrode.

Advantageous Effects of Invention

According to the present invention, it is possible to suppress the characteristic change of the on-resistance without lowering the off-breakdown voltage of the switch element.

DESCRIPTION OF EMBODIMENTS

Hereinafter, current detecting MOSFETs according to embodiments of the present invention and load control apparatuses using the current detecting MOSFETs will be described. Although a case of using a negative channel metal oxide semiconductor field effect transistor (NMOSFET) is described in the present embodiment, a positive channel metal oxide semiconductor field effect transistor (PMOSFET) may be used. Furthermore, a bipolar transistor such as an insulated gate bipolar transistor (IGBT) may be used.

First Embodiment

Figure 1A:
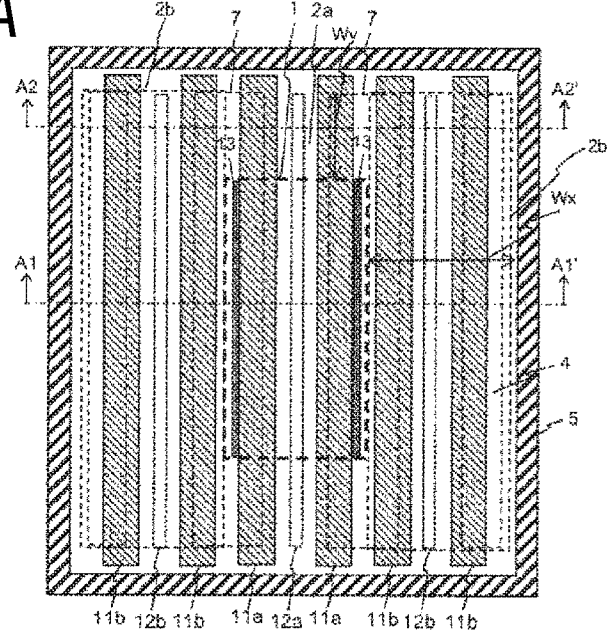
FIG. 1A is a plan layout diagram of a current detecting MOSFET according to a first embodiment of the present invention.
Figure 1B:
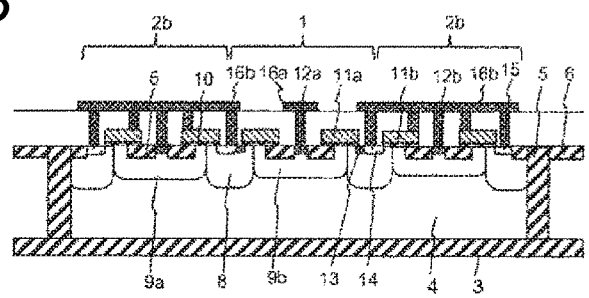
FIG. 1B is a longitudinal sectional view in a region illustrated by A1-A1' in FIG. 1A.
Figure 1C:
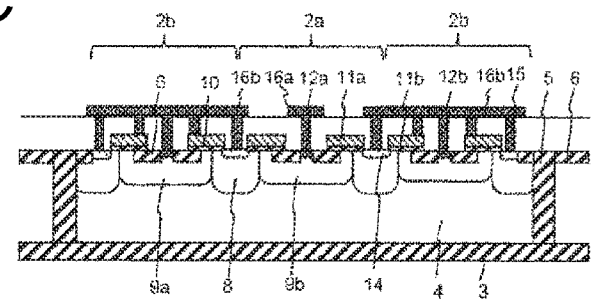
FIG. 1C is a longitudinal sectional view in the region illustrated by A2-A2' in FIG. 1A.

A structure of a current detecting MOSFET according to an embodiment of the present invention will be described with reference to FIG. 1. FIG. 1(a) is a plan layout diagram of the current detecting MOSFET according to a first embodiment. Furthermore, FIG. 1(b) is a longitudinal sectional view in a region illustrated by A1-A1' in FIG. 1 a), and FIG. 1(c) is a longitudinal sectional view in a region illustrated by A2-A2' in FIG. 1(a).

The MOSFET is formed, including an insulating trench 5 that has a buried insulating film and is formed on a semiconductor substrate 4 having a silicon-on-insulator (SOI) layer 3 and a plurality of gate electrode layers 11a and 11b having a field plate on the buried insulating film 6. In the MOSFET, there are continuously formed an active MOSFET region 1 in which, when a voltage is applied to the gate electrode layer 11a, a current flows on the semiconductor substrate 4 and an inactive MOSFET region 2a in which, when the voltage is applied to the gate electrode layer 11a, no current flows between the insulating trench 5 and the active MOSFET region 1 on the semiconductor substrate 4. Note that the inactive MOSFET region 2a is formed by forming an impurity layer 14 having a polarity opposite to a polarity of a source 13 in a source region and not providing a source.

Even if a voltage is applied to the gate electrode 11a and the drain 12a, there is no source 13, and no electron that becomes a carrier is injected. Therefore, no drain current flows.

Meanwhile, in a case where a voltage between the gate electrode 11a and the source 13 becomes 0 and the active MOSFET region 1 goes into an off state, a breakdown voltage of the inactive MOSFET region 2a becomes equal to an off-breakdown voltage of the active MOSFET region 1, and an off-breakdown voltage of the MOSFET does not change. This is because, since a gate field plate 11a and a drain drift 9b are continuously arranged across the active MOSFET region 1 and the inactive MOSFET region 2a, an electric field distribution in the drain drift 9b that determines the off-breakdown voltage can be matched between the active MOSFET region 1 and the inactive MOSFET region 2a.

Furthermore, the gate electrode layer 11b between the insulating trench 5 and the active MOSFET region 1 and the drain 12b are electrically connected via the source 13 and a wiring layer 16b, and an inactive MOSFET region 2b in which no current flows on the semiconductor substrate 4 is formed.

Figure 2:
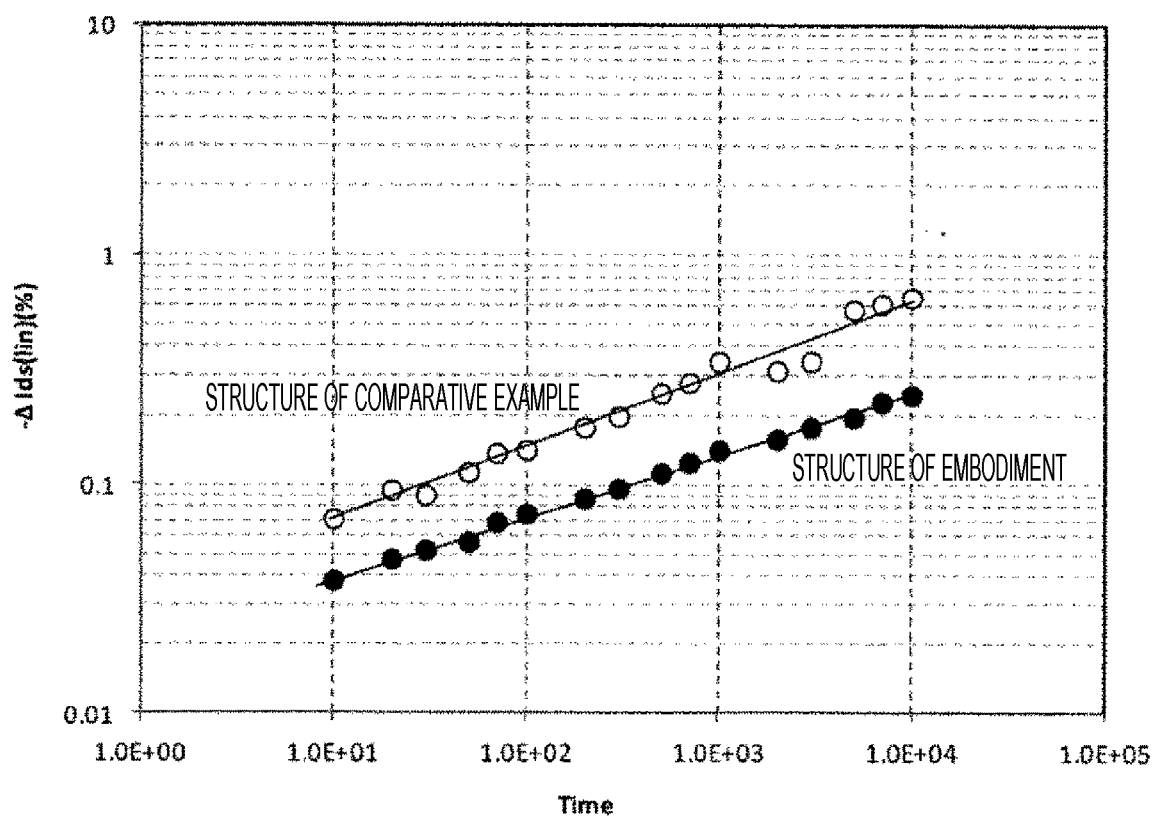
FIG. 2 is a graph illustrating an amount of temporal change in an on-resistance increase in the current detecting MOSFET according to the first embodiment of the present invention and a MOSFET having a structure of a comparative example illustrated in FIG. 3.
Figure 3:
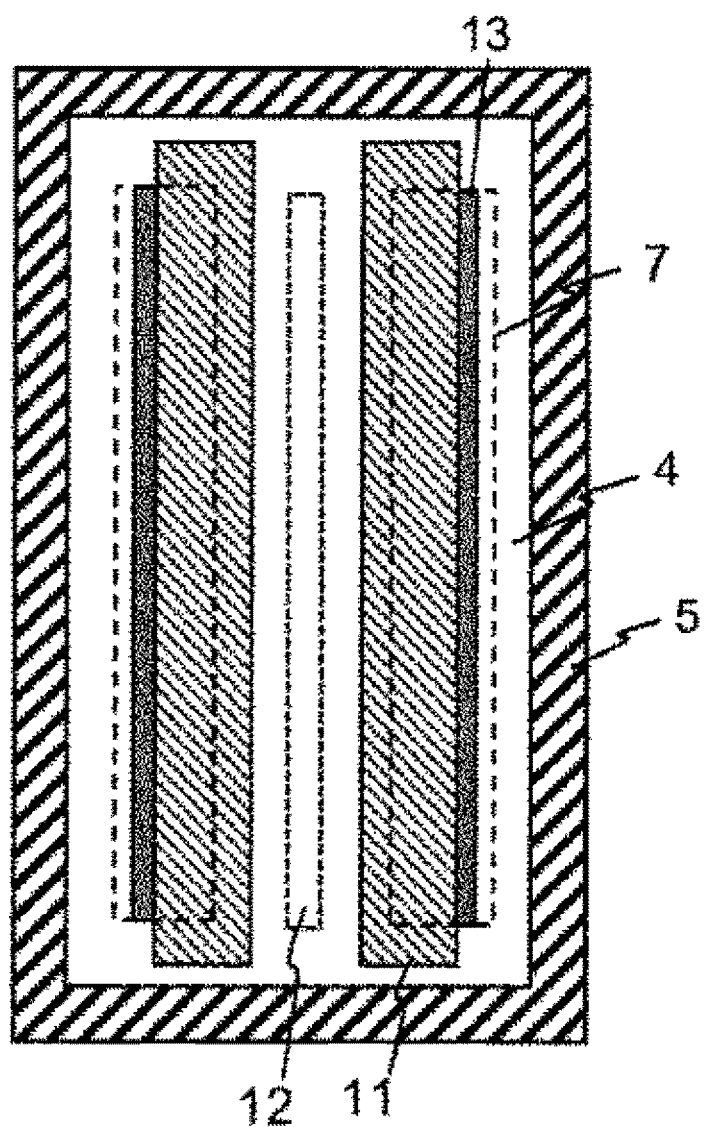
FIG. 3 is a plan layout diagram of the MOSFET having the structure of the comparative example.

Herein, FIG. 2 illustrates an amount of temporal change in the on-resistance increase due to a hot carrier phenomenon in the structure according to the present embodiment, the amount of temporal change being measured by the inventors. The structure of a comparative example is a structure without an inactive MOSFET region as illustrated in FIG. 3. A rate of increase in the on-resistance is large in the structure of the comparative example and small in the structure according to the present embodiment. On the other hand, although not illustrated in the figure, a gate width in the active MOSFET region, an initial-stage on-resistance value, and an off-breakdown voltage are each equal between the structure according to the present embodiment and the structure of the comparative example.

Figure 4:
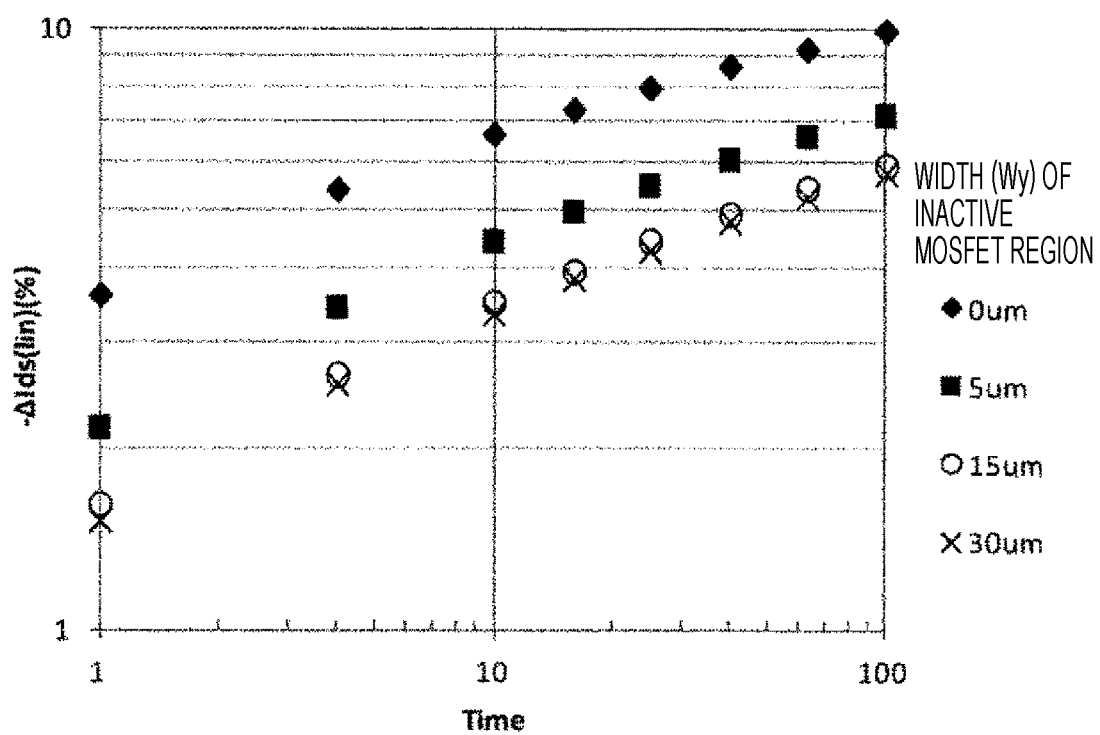
FIG. 4 is a graph illustrating the dependence of the amount of temporal change in the on-resistance increase in the current detecting MOSFET according to the first embodiment of the present invention with respect to the width (Wy) of an inactive MOSFET region.

Furthermore, FIG. 4 illustrates measurements on the dependence of the amount of change in the on-resistance on the Y-directional width (Wy) of the inactive region 2a, the dependence of the amount of change being measured by the inventors to verify the effect of the inactive region. Herein, the X directional width (Wx) of an inactive region 2b is fixed to 12 μm. It is found that as the width of the inactive region 2 increases, the amount of change in the on-resistance decreases, there is no difference seen between structures with widths of 15 μm and 30 μm, and the amount of change tends to saturate.

Although not illustrated in the figure, it is found that the dependence of the X directional width (Wx) of the inactive region 2b is similar to the dependence of the Y directional width (Wy) of the inactive region 2a, and as the X directional width (Wx) increases, the amount of change in the on-resistance tends to decrease and saturate.

On the basis of the above results, the width of the inactive region 2a is set to a distance at least not less than the insulating trench depth at which the influence of stress from the insulating trench is small. In this way, the effect of the present invention can be obtained.

Furthermore, as described in, for example, JP 2010-258226 A, a change in an on-resistance due to a hot carrier phenomenon is caused by an electron trap at an interface between an oxide layer of a shallow trench isolation (STI) edge portion and an Si substrate 4. Therefore, the amount of the electron trap at the interface between an oxide film and the Si substrate 4 in the STI edge portion adjacent to the insulating trench 5 in the MOSFET is considered to be larger than that in the STI edge portion located in a region distant from the insulating trench 5 in the MOSFET.

Herein, since the size of the current detecting MOSFET is smaller than that of the current driving MOSFET, the MOSFET region near to the insulating trench occupies a relatively large proportion. As a result, the amount of change in the on-resistance of the current detecting MOSFET is considered to become larger than that of the current driving MOSFET.

According to the present embodiment, in the current detecting MOSFET, MOSFET regions that are adjacent to the insulating trench 5 and in which the amount of change in the on-resistance is large are defined as inactive regions 2a and 2b in which the drain current does not flow, and a MOSFET region distant from the insulating trench 5 is defined as an active region 1 in which the drain current flows. Thus, the amount of change in the on-resistance due to the hot carrier phenomenon can be reduced and made nearly the same level as that of the current driving MOSFET. As a result, it is possible to suppress a temporal variation in a current sense ratio and improve the accuracy of current detection.

As described above, the MOSFET according to the present embodiment includes a semiconductor substrate, an insulating trench provided on the semiconductor substrate, and a MOSFET region provided on the semiconductor substrate so as to be surrounded by the insulating trench and having a gate electrode located on the buried insulating film. The gate electrode includes a field plate region extending to a drain drift region. In the MOSFET region, an active MOSFET region in which a drain current flows and an inactive MOSFET region provided between the insulating trench and the active MOSFET region and in which the drain current does not flow are continuously formed across the gate electrode.

With such a configuration, it is possible to reduce the amount of temporal increase in the on-resistance of the MOSFET due to the hot carrier phenomenon. Furthermore, by continuously forming a field plate region that relaxes an electric field in the drain drift region across the active MOSFET region and the inactive MOSFET region, it is possible to maintain the off-breakdown voltage of the MOSFET.

Furthermore, the MOSFET according to the present embodiment includes, in the current detecting MOSFET that is connected in parallel to the current driving MOSFET and detects an energizing current in the current driving MOSFET, the insulating trench provided on the semiconductor substrate, the gate electrode provided so as to be surrounded by the insulating trench, the gate electrode being located on the buried insulating film, and the MOSFET region including the field plate region in which the gate electrode is extended to the drain drift region. The MOSFET region includes the active MOSFET region in which the drain current flows and the inactive MOSFET region provided between the insulating trench and the active MOSFET region and in which the drain current does not flow.

With such a configuration, it is possible to suppress the temporal variation in the current sense ratio and improve the accuracy of the current detection by the current detecting MOSFET. Preferably, the inactive MOSFET regions are provided in a direction parallel to an arrangement direction of the plurality of gate electrodes and in a direction perpendicular to the arrangement direction of the plurality of gate electrodes. An impurity layer having a polarity opposite to a polarity of an impurity layer forming the source is formed in the source region of the MOSFET region.

With such a configuration, the inactive MOSFET region can be configured to have the same structure as that of the active MOSFET region, except for the source region of the active MOSFET region, and characteristics such as the off-breakdown voltage can be maintained.

Preferably, the semiconductor substrate is an SOI substrate, a depth of the insulating trench is equal to the thickness of an Si active layer, and the inactive MOSFET region is formed such that a distance between the active MOSFET region and the insulating trench is at least larger than the depth of the insulating trench.

With such a configuration, it is possible to reduce the influence of stress from the insulating trench to the Si substrate and the like in the active MOSFET region and suppress the temporal change in the on-resistance of the MOSFET due to the hot carrier phenomenon. Therefore, it is possible to suppress the temporal variation in the current sense ratio and improve the accuracy of current detection by the current detecting MOSFET.

Preferably, the inactive MOSFET region includes a first inactive MOSFET region arranged parallel to an arrangement direction of the plurality of gate electrodes and a second inactive MOSFET region arranged perpendicularly to the direction of arrangement of the plurality of gate electrodes. A gate electrode of the second inactive MOSFET region is electrically connected to a source of the active MOSFET region. Furthermore, preferably, the inactive MOSFET region includes a first inactive MOSFET region arranged in parallel to the arrangement direction of the plurality of gate electrodes and a second inactive MOSFET region arranged perpendicularly to the arrangement direction of the plurality of gate electrodes. The second inactive MOSFET region has no gate electrode, and the drain of the second inactive MOSFET region and the source of the active MOSFET region are electrically connected.

With such a configuration, it is possible to suppress a variation in the current sense ratio without lowering the off-breakdown voltage performance of the current detecting MOSFET and further without changing the current performance in the active MOSFET region. As a result, it is possible to improve the accuracy of the current detection by the current detecting MOSFET.

Furthermore, in a load control and current control apparatus including the current driving MOSFET and the current detecting MOSFET that is connected in parallel to the current driving MOSFET and that detects an energizing current of the current driving MOSFET in the MOSFET according to the present embodiment, the current detecting MOSFET includes the MOSFET region including the insulating trench provided on the semiconductor substrate, and the gate electrode provided on the semiconductor substrate so as to be surrounded by the insulating trench, the gate electrode being located on the buried insulating film. The gate electrode includes the field plate region extending to the drain drift region. In the MOSFET region, the active MOSFET region and the inactive MOSFET region provided between the insulating trench and the active MOSFET region are continuously formed across the gate electrode. An interval between the gate electrodes of the current detecting MOSFET is made equal to an interval between the gate electrodes of the driving MOSFET.

With such a configuration, it is possible to suppress a difference in the amount of increase in the on-resistance due hot carriers between the current driving MOSFET and the current detecting MOSFET and improve the temporal variation in the current sense ratio. Therefore, it is possible to improve the accuracy of the current control of the load control apparatus. Furthermore, the gate width of the current detecting MOSFET is preferably set to be $1/100$ or less compared with the gate width of the driving MOSFET.

With such a configuration, it is possible to reduce the detection current flowing in the current detecting MOSFET sufficiently with respect to the drive current flowing in the current driving MOSFET. Therefore, it is possible to reduce the loss of the load control apparatus.

Hereinafter, the significance of applying the above-described structure of the switch element to the current detecting MOSFET will be described.

In recent years, as electronic control of in-vehicle parts progresses, electric actuators such as motors and solenoids are increasingly used. In order to control the electric actuator with high accuracy, it is necessary to control the drive current value of the electric actuator with high accuracy. For this reason, it is necessary to accurately detect the drive current value of the electric actuator.

Among methods for accurately detecting the drive current value, as a method for doing the same with relatively lower loss and higher efficiency than a method using a resistive element, there is a method of connecting a current detecting MOSFET that detects a current in parallel to a current driving MOSFET that outputs a drive current (for example, see JP 2006-203415 A). By setting the gate width of the current detecting MOSFET to about $1/100$ to $1/1000$ with respect to the gate width of the current driving MOSFET, it is possible to set the current flowing in the current detecting MOSFET to about $1/100$ to $1/1000$ with respect to the drive current flowing in the current driving MOSFET. Therefore, it is possible to perform low-loss current detection.

Herein, deterioration of electric characteristics occurs in the MOSFET due to an electron trapping phenomenon (hot carrier phenomenon) into the oxide film due to the impact ionization of a current during an on operation. Particularly, in a laterally diffused metal oxide semiconductor field effect transistor (LDMOSFET) using a fine process of 0.25 μm generation or lower, a shallow trench isolation (STI) is often used as a thick oxide film. However, current concentration occurs at the corner portion of the STI during the on operation, and the on-resistance increases with time (for example, JP 2010-258226 A).

Meanwhile, the accuracy of the current detection by the current detecting MOSFET is determined by a current ratio of the current driving MOSFET and the current detecting MOSFET (sense ratio: the molecule is the current value of the current detecting MOSFET and the denominator is the current value of the current driving MOSFET). For this reason, the increase in the on-resistance of the MOSFET due to the hot carrier phenomenon described above does not become an issue as long as the rate of change in the current in the current driving MOSFET is the same as that in the current detecting MOSFET. This is because the current sense ratio does not change.

Figure 8:
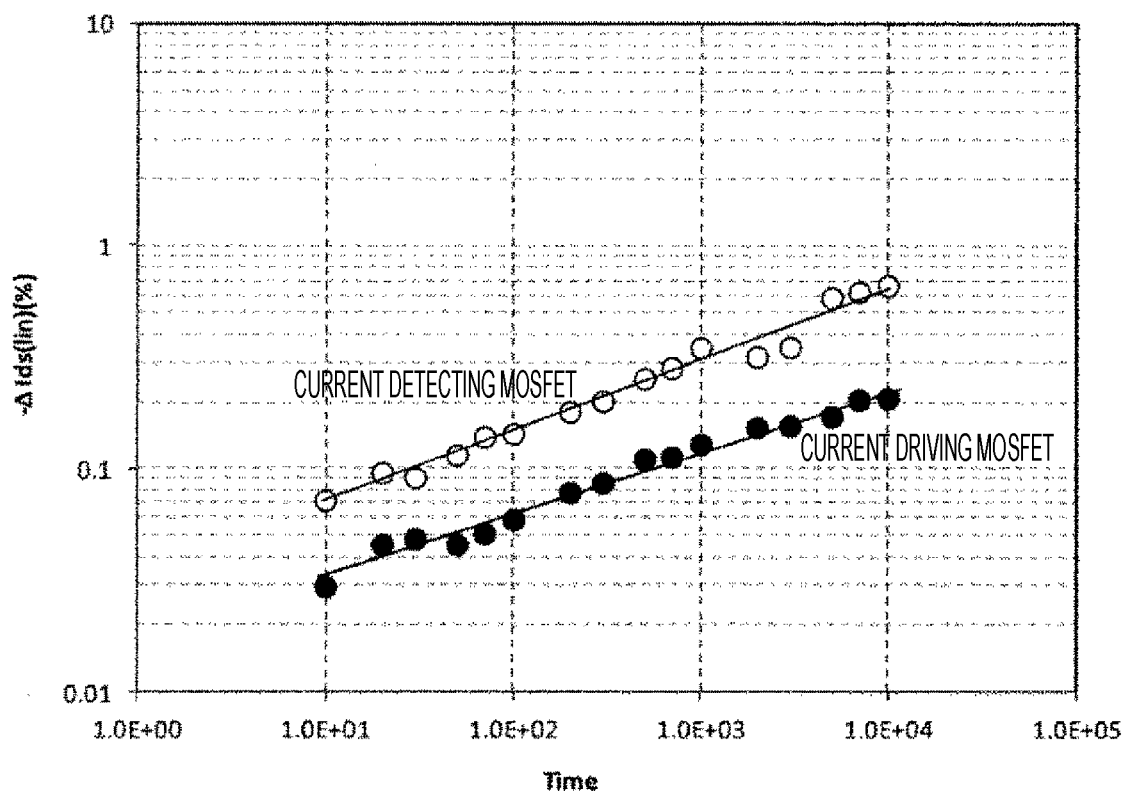
FIG. 8 is a graph illustrating an amount of temporal change in the on-resistance in a conventional current detecting MOSFET and a current driving MOSFET having gate widths, a ratio between which is 1:2000 and being greatly different each other in size.

However, in a MOSFET having a plurality of gates surrounded by the trench formed on the semiconductor substrate for the purpose of insulation separation, the current driving MOSFET and the current detecting MOSFET that are different in the gate width, that is, the size of the MOSFET, a phenomenon in which the rate of increase in the on-resistance due to the hot carrier phenomenon is different is found (FIG. 8). Since the rate of increase in the on-resistance is larger in the current detecting MOSFET with a small size than in the current driving MOSFET with a large size, the current sense ratio decreases with the operation time. For this reason, there is also a problem that the accuracy of current detection decreases in a load control and current control apparatus using a current detecting MOSFET for current detection.

In this respect, with the above-described switch element, it is possible to obtain the current detecting MOSFET capable of reducing the amount of temporal change in the on-resistance due to the hot carrier phenomenon. It is also possible to obtain the current detecting MOSFET capable of suppressing the temporal variation in the current sense ratio and improving the detection accuracy of a drive current amount by the current detecting MOSFET.

Second Embodiment

Figure 5A:
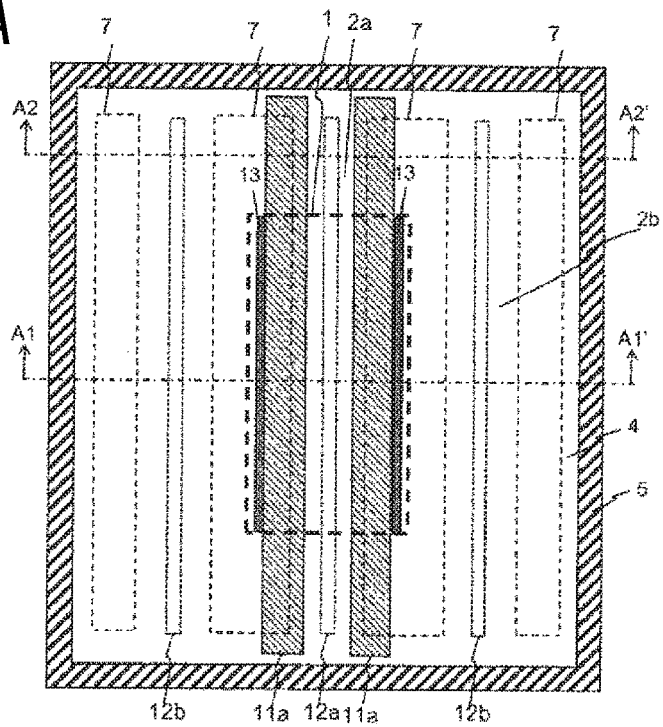
FIG. 5A is a plan layout diagram of a current detecting MOSFET according to a second embodiment of the present invention.
Figure 5B:
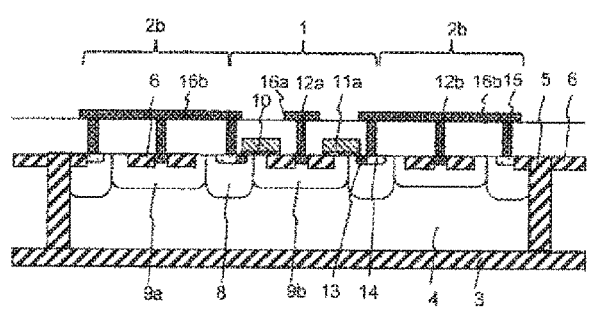
FIG. 5B is a longitudinal sectional view in a region illustrated by FIG. 5A A1-A1'.
Figure 5C:
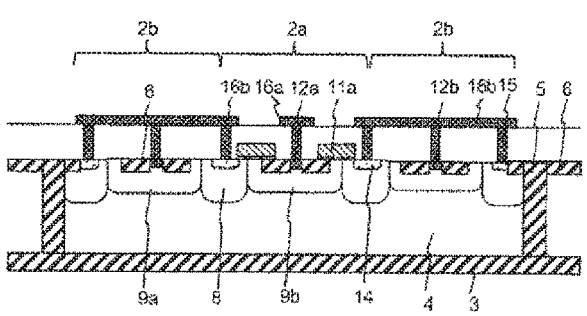
FIG. 5C is a longitudinal sectional view in a region illustrated by FIG. 5A A2-A2'.

Next, a structure of a current detecting MOSFET according to a second embodiment will be described with reference to FIG. 5. FIG. 5(a) is a plan layout diagram of the current detecting MOSFET according to the present embodiment. Furthermore, FIG. 5(b) is a longitudinal sectional view in a region illustrated by A1-A1' in FIG. 5(a). FIG. 5(c) is a longitudinal sectional view in a region illustrated by A2-A2' in FIG. 5(a).

The MOSFET is formed, including an insulating trench 5 that has a buried insulating film and is formed on a semiconductor substrate 4 having an SOI layer 3 and a plurality of gate electrode layers 11a having a field plate on the buried insulating film 6. In the MOSFET, there are continuously formed an active MOSFET region 1 in which, when a voltage is applied to the gate electrode layer 11a, a current flows on the semiconductor substrate 4 and an inactive MOSFET region 2a in which, when the voltage is applied to the gate electrode layer 11a, no current flows between the insulating trench 5 and the active MOSFET region 1 on the semiconductor substrate 4. Note that the inactive MOSFET region 2a is formed by forming an impurity layer having a polarity opposite to a polarity of a source in a source region and not providing a source.

Furthermore, a drain 12b located between the insulating trench 5 and the active MOSFET region 1 is electrically connected via a source 13 and a wiring layer 16b, and an inactive MOSFET region 2b in which no current flows on the semiconductor substrate 4 is formed. A difference from the structure according to the first embodiment illustrated in FIG. 1 is that there is no gate electrode layer 11b. Since no voltage is applied between the drain 12b and the source 13, there may be no gate electrode layer 11b serving as a field plate for securing an off-breakdown voltage of an inactive region 2b.

With this configuration, as with the first embodiment illustrated in FIG. 1, it is possible to reduce the amount of change in an on-resistance of the current driving MOSFET and make the amount of change in the on-resistance of the current driving MOSFET nearly equal to that in the current driving MOSFET. As a result, it is possible to suppress a temporal variation in a current sense ratio and improve the accuracy of current detection.

Third Embodiment

Figure 6:
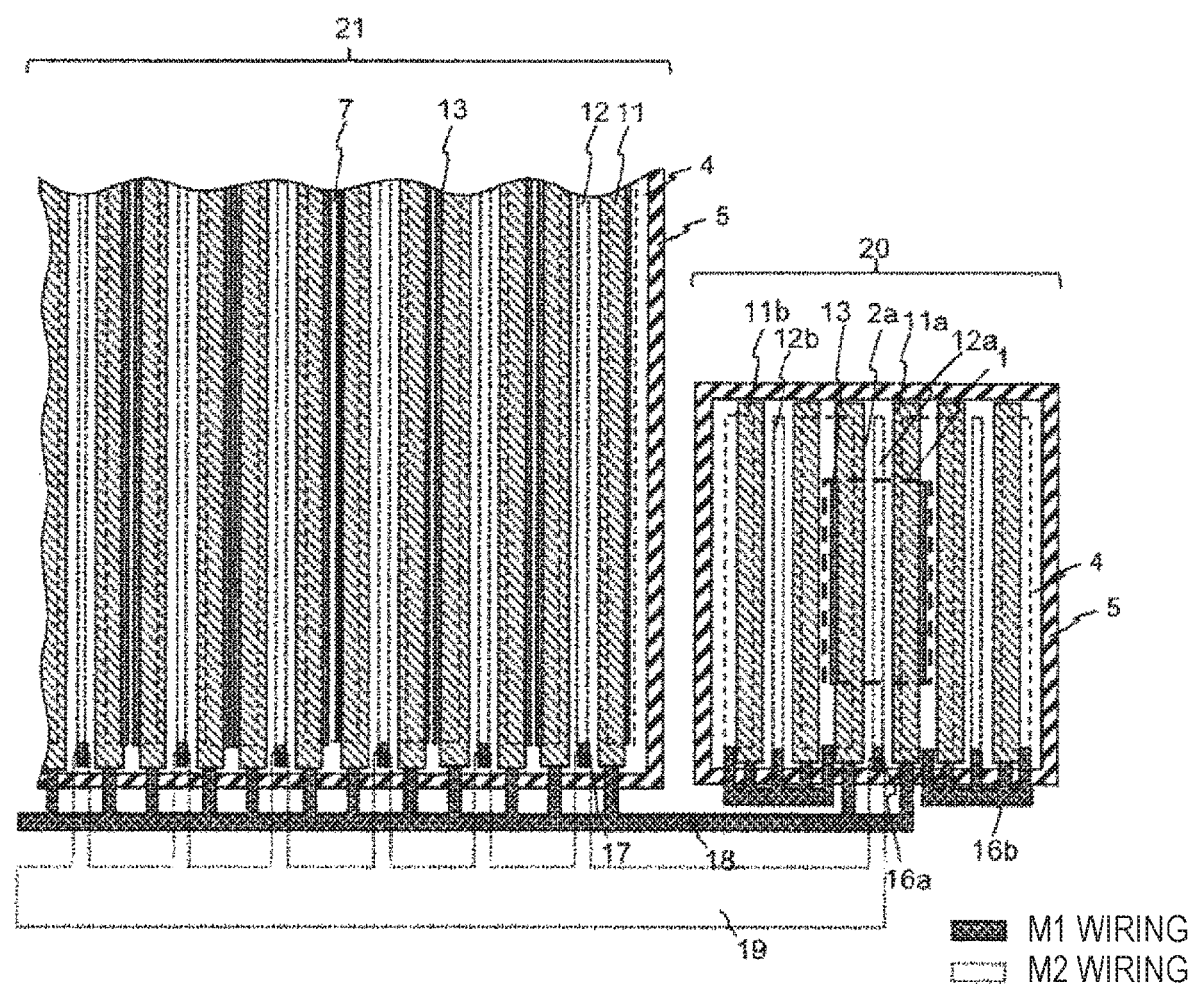
FIG. 6 is a plan layout diagram of a current detecting MOSFET and a current driving MOFET in a load control and current control apparatus according to a third embodiment of the present invention.

A third embodiment will be described with reference to FIGS. 6 and 7. FIG. 6 is a plan layout diagram illustrating a current detecting MOSFET 20 and a current driving MOSFET 21 in a load control apparatus 34 using, for example, a linear solenoid as an electromagnetic load illustrated in FIG. 7. Both the current detecting MOSFET 20 and the current driving MOSFET 21 are surrounded by an insulating trench 5 and have a plurality of gate electrodes and an interval between gate electrode layers 11a and 11b of the current detecting MOSFET 20 is equal to an interval between gate electrode layers 11 of the current driving MOSFET 21 and the current driving MOSFET 21. As a result, current characteristics and an off-breakdown voltage per unit gate length of the MOSFET are equal between the current detecting MOSFET 20 and the current driving MOSFET 21.

As illustrated in FIG. 1, in the current detecting MOSFET 20, a MOSFET region adjacent to the insulating trench 5 is defined as inactive regions 2a and 2b and a MOSFET region distant from the insulating trench 5 surrounded by the inactive regions 2a and 2b is defined as an active region 1. A gate electrode 11b and a drain 12b of the inactive region 2b are electrically connected by a source 13 and a wiring layer 16b. Furthermore, a gate electrode 11a of the active region 1 and the inactive region 2a is electrically connected to the gate electrode 11 of the current driving MOSFET 21 by a wiring layer 18. Additionally, a drain 12a of the active region 1 and the inactive region 2a is electrically connected to a drain 12 of the current driving MOSFET 21.

Figure 7:
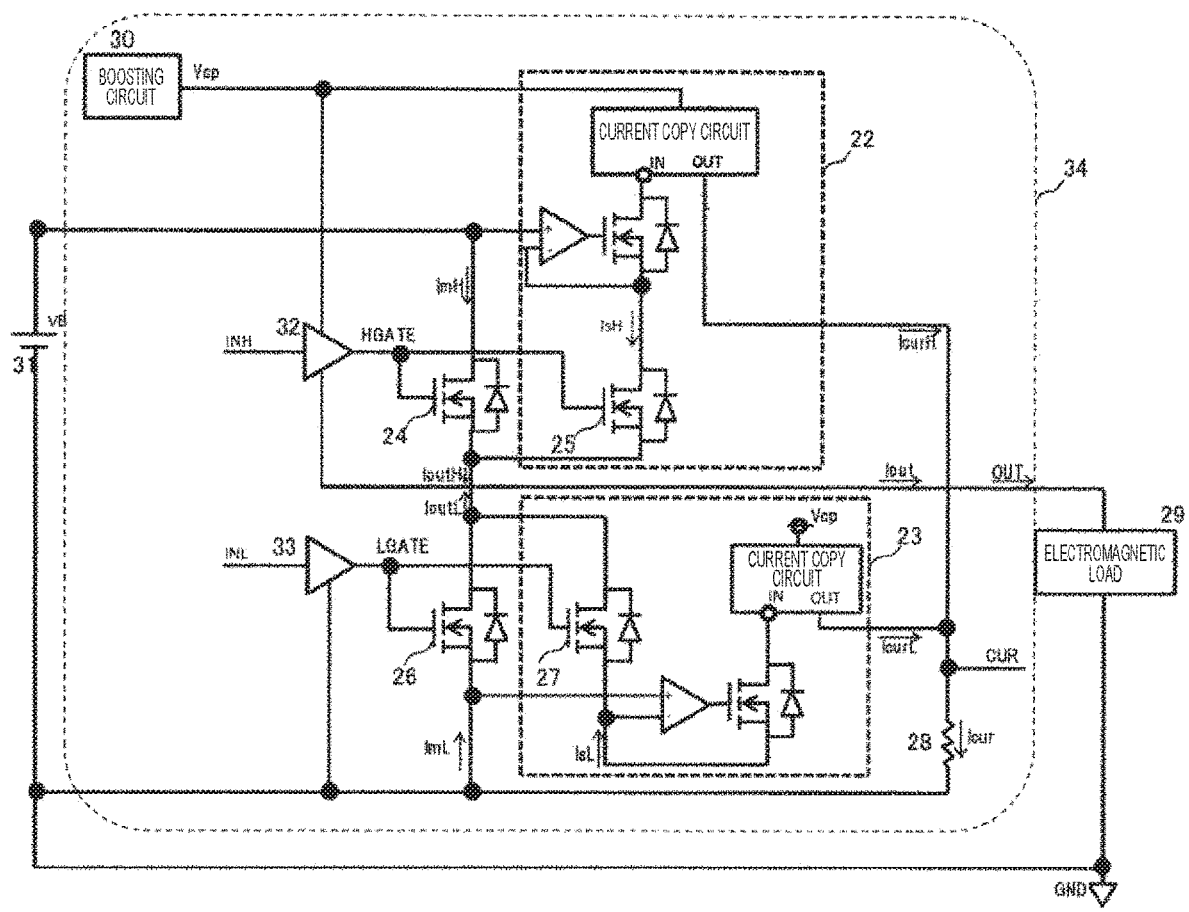
FIG. 7 is a circuit diagram of a load control apparatus according to the third embodiment of the present invention.

Furthermore, as illustrated in FIG. 7, the source 13 of each MOSFET is input to an operational amplifier and is mutually in a virtual short-circuit state. Therefore, terminal voltages in a current detecting MOSFET 27 and a current driving MOSFET 26 are typically the same. As a result, a detection current flowing in the current detecting MOSFET 27 and a driving current flowing in the current driving MOSFET 26 are proportional to a gate width of each other. In FIG. 6, the gate width of the current detecting MOSFET 20 is as small as 1/100 to 1/5000 of the gate width of the current driving MOSFET 21, and the detection current flowing in the current detecting MOSFET 20 is sufficiently small. Therefore, it is possible to perform current control. Furthermore, the size of the current detecting MOSFET 20 is sufficiently smaller than the size of the current driving MOSFET 21, and the influence of an increase in chip size due to providing the inactive regions 2a and 2b in the current detecting MOSFET 20 is small. Furthermore, as described above in each embodiment, it is possible to reduce the amount of change in an on-resistance of the current detecting MOSFET 27 and make the amount of change in the on-resistance of the current detecting MOSFET 27 almost equal to that in an on-resistance of the current driving MOSFET 26. Therefore, it is possible to suppress a variation in a current sense ratio and improve the current control in the load control apparatus.

Furthermore, in FIG. 7, the same effect as that of the current detecting MOSFET 27 of a low-side current detection circuit 23 described above is obtained in a current detecting MOSFET 25 of a high-side current detection circuit 22.

In the above-described embodiment, the MOSFET including the gate, the source and the drain as the control electrode is described as an example. However, the present invention is not limited to this, and the present invention can be applied to other switch elements, for example, a bipolar transistor including a base as a control electrode, a collector, and an emitter.

REFERENCE SIGNS LIST 1 active MOSFET region
2a inactive MOSFET region (in y direction)
2b inactive MOSFET region (in x direction)

3 SOI layer
4 Si substrate
5 insulating trench
6 shallow trench isolation (STI)
7 MOSFET region that excludes drain and in which STI is not formed
8 Body region
9a drain drift layer in active MOSFET region and inactive MOSFET region (2a)
9b drain drift layer in the inactive MOSFET region (2b)
10 gate oxide film
11a gate electrode layer in active MOSFET region and inactive MOSFET region (2a)
11b gate electrode layer in the inactive MOSFET region (2b)
12a drain in active MOSFET region and inactive MOSFET region (2a)
12b drain in inactive MOSFET region (2b)
13 source
14 impurity diffusion layer for body connection
15 wiring layer connection contact
16a drain wiring layer
16b wiring layer connecting inactive MOSFET region (2b) and source
17 wiring layer connecting drain of the current driving MOSFET
18 wiring layer connecting gate of current driving MOSFET and gate of current detecting MOSFET
19 wiring layer connecting drain of current driving MOSFET and drain of current detecting MOSFET
20 current detecting MOSFET
21 current driving MOSFET
22 high-side current detection circuit
23 low-side current detection circuit
24 high-side current driving NMOSFET
25 high-side current detecting NMOSFET
26 low-side current driving NMOSFET
27 low-side current detecting NMOSFET
28 resistive element
29 electromagnetic load
30 boosting circuit
31 power supply
32 high-side pre-driver
33 low-side pre-driver
34 load control apparatus

The invention claimed is:

1. A switch element comprising:
a semiconductor substrate,
a plurality of control electrodes, each of which is a gate electrode;
an active element region; and
a plurality of inactive element regions,
wherein the active element region and the plurality of inactive element regions are formed adjacent to each other, such that, when viewed in a plan view, the active element region has at least one inactive element region of the plurality of inactive element regions arranged next to each of all four sides of the active element region;
a source, having a first polarity, in the active element region;
a source region, having a second polarity, in the plurality of inactive element regions;
an impurity layer, having the second polarity, in the source region of the plurality of inactive element regions;
wherein, the impurity layer is not the source region; and
wherein the plurality of control electrodes is implemented on the semiconductor substrate.

2. The switch element according to claim 1, further comprising:
an insulating trench provided on the semiconductor substrate,
wherein the active element region and the plurality of inactive element regions are provided so as to be surrounded by the insulating trench, and
the plurality of inactive element regions is provided between the insulating trench and the active element region.

3. The switch element according to claim 2,
wherein the switch element is a current detecting switch element configured to detect an energization current to a load.

4. The switch element according to claim 2,
wherein the semiconductor substrate is an SOI substrate, and the plurality of inactive element regions is formed such that a depth of the insulating trench is equal to a thickness of an Si active layer, and
a distance between the active element region and the insulating trench is larger than at least the depth of the insulating trench.

5. A switch element comprising:
a plurality of control electrodes, each of which is a gate electrode;
an active element region; and
a plurality of inactive element regions,
wherein the active element region and the plurality of inactive element regions are formed adjacent to each other, such that, when viewed in a plan view, the active element region has at least one inactive element region of the plurality of inactive element regions arranged next to each of all four sides of the active element region;
a source, having a first polarity, in the active element region;
a source region, having a second polarity, in the plurality of inactive element regions;
an impurity layer, having the second polarity, in the source region of the plurality of inactive element regions;
wherein, the impurity layer is not the source region; and
wherein the plurality of inactive element regions includes a first set of inactive element regions arranged next to top and bottom sides of the active element region when viewed in the plan view, and
a second set of inactive element regions arranged next to left and right sides of the active element region when viewed in the plan view, and
a control electrode of the second set of inactive element regions is electrically connected to a source of the active element region.

6. The switch element according to claim 5
wherein a drain of the second set of inactive element regions is electrically connected to the source in the active element region.

7. A load driving apparatus comprising:
a current driving switch element; and
a current detecting switch element connected in parallel to the current driving switch element, the current detecting switch element detecting an energization current of the current driving switch element, wherein the current detecting switch element includes at least
- a plurality of control electrodes, each of which is a gate electrode,
- an active element region, and
- a plurality of inactive element regions, and wherein the active element region and the plurality of inactive element regions are formed adjacent to each other, such that, when viewed in a plan view, the active element region has at least one inactive element region of the plurality of inactive element regions arranged next to each of all four sides of the active element region;

a source, having a first polarity, in the active element region;

a source region, having a second polarity, in the plurality of inactive element regions;

an impurity layer, having the second polarity, in the source region of the plurality of inactive element regions;

wherein, the impurity layer is not the source region.

\* \* \* \* \*